(12) United States Patent
Okawa et al.

(10) Patent No.: US 12,283,619 B2
(45) Date of Patent: Apr. 22, 2025

(54) NITRIDE SEMICONDUCTOR DEVICE AND METHOD OF MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP); Kochi Prefectural Public University Corporation, Kochi (JP)

(72) Inventors: Takashi Okawa, Nisshin (JP); Hidemoto Tomita, Nisshin (JP); Toshiyuki Kawaharamura, Kami (JP); Li Liu, Kami (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); Kochi Prefectural Public University Corporation, Kochi (JP)

( * ) Notice: Subject to any disclaimer, the term of this patent is extended or adjusted under 35 U.S.C. 154(b) by 526 days.

(21) Appl. No.: 17/591,012

(22) Filed: Feb. 2, 2022

(65) Prior Publication Data

US 2022/0271144 A1   Aug. 25, 2022

(30) Foreign Application Priority Data

Feb. 25, 2021   (JP) .................................. 2021-029176

(51) Int. Cl.
*H01L 29/51* (2006.01)
*H01L 21/02* (2006.01)
*H01L 21/28* (2006.01)

(52) U.S. Cl.
CPC ........ *H01L 29/518* (2013.01); *H01L 21/0214* (2013.01); *H01L 21/28264* (2013.01); *H01L 29/513* (2013.01)

(58) Field of Classification Search
CPC ............. H01L 21/28264; H01L 29/518; H01L 21/02271; H01L 29/78; H01L 21/0214;
(Continued)

(56) References Cited

U.S. PATENT DOCUMENTS

| 6,521,912 B1 * | 2/2003 | Sakama | H01L 29/6675 |
|---|---|---|---|
| | | | 257/E21.414 |
| 2011/0001179 A1 * | 1/2011 | Yanagi | H01L 29/66833 |
| | | | 257/315 |

(Continued)

FOREIGN PATENT DOCUMENTS

JP   2008-103408 A   5/2008

OTHER PUBLICATIONS

U.S. Appl. No. 17/590,988, filed Feb. 2, 2022, Tomita et al.

*Primary Examiner* — Mouloucoulaye Inoussa
(74) *Attorney, Agent, or Firm* — Posz Law Group, PLC

(57) ABSTRACT

A method for manufacturing a nitride semiconductor device includes formation of a gate insulation film above a nitride semiconductor layer. The formation of the gate insulation film includes formation of silicon oxynitride film in contact with a surface of the nitride semiconductor layer. The formation of the silicon oxynitride film includes oxidation of a film source material having both of silicon and nitride in a molecule to form the silicon oxynitride film.

11 Claims, 4 Drawing Sheets

(58) Field of Classification Search
CPC .......... H01L 29/513; H01L 29/66522; H01L 29/66568; H01L 29/2003; H01L 29/78648; H01L 29/66969; H01L 27/1225; H01L 29/45; H01L 29/7869; H01L 27/1255; H01L 21/0228; H01L 29/7813; H01L 29/778; H01L 29/7786; H01L 29/7787; H01L 29/66462; H01L 29/205; H01L 29/4966; H01L 29/4236; H01L 29/0886; H01L 21/02274; H01L 21/02389; H01L 29/517; H01L 21/02178; H01L 21/02214; H01L 29/267; H01L 21/0254; H01L 29/207; H01L 21/26546; H01L 21/02299; H01L 21/02579; H01L 21/0262; H01L 21/266; H01L 21/2258; H01L 29/7391; H01L 29/4925; H01L 29/4983; H01L 29/083; H01L 29/41758; H01L 29/423; H01L 29/42368; H01L 29/66356; G02F 1/1368; H10K 59/1213
See application file for complete search history.

(56) References Cited

U.S. PATENT DOCUMENTS

| | | | | |
|---|---|---|---|---|
| 2011/0114940 A1* | 5/2011 | Kim | .................. | H01L 21/02554 257/E29.296 |
| 2012/0100684 A1* | 4/2012 | Min | .................. | H01L 21/28185 257/E21.423 |
| 2012/0231600 A1* | 9/2012 | Yang | .................. | H01L 21/28185 257/E21.409 |
| 2012/0248545 A1* | 10/2012 | Yugami | ............. | H01L 21/28194 257/E21.632 |
| 2013/0200367 A1 | 8/2013 | Yamazaki et al. | | |
| 2013/0234236 A1* | 9/2013 | Yanagi | .................. | H10B 41/30 257/326 |
| 2013/0337660 A1 | 12/2013 | Ota et al. | | |
| 2014/0127630 A1* | 5/2014 | Shinde | ................ | C01B 21/0823 423/325 |
| 2015/0102341 A1* | 4/2015 | Yamazaki | ........... | H01L 29/7869 257/43 |
| 2015/0162451 A1 | 6/2015 | Yamazaki et al. | | |
| 2016/0013282 A1* | 1/2016 | Murakami | .......... | H01L 29/2003 438/589 |
| 2016/0225857 A1* | 8/2016 | Saito | .................... | H01L 21/0228 |
| 2016/0247917 A1* | 8/2016 | Kondo | ................ | H01L 29/7391 |
| 2016/0293620 A1* | 10/2016 | Ogata | ................. | H01L 21/0214 |
| 2016/0315165 A1* | 10/2016 | Lee | .................... | H01L 29/42364 |
| 2017/0200738 A1* | 7/2017 | Kim | .................. | H01L 29/66439 |
| 2018/0026124 A1 | 1/2018 | Shimizu et al. | | |
| 2018/0211965 A1* | 7/2018 | Yoshida | .................. | H01L 21/28 |
| 2019/0006184 A1 | 1/2019 | Matsuyama et al. | | |
| 2020/0203532 A1* | 6/2020 | Yamazaki | ......... | H01L 29/78648 |
| 2020/0402788 A1* | 12/2020 | Hashimoto | ........... | H01L 21/022 |
| 2020/0411675 A1* | 12/2020 | Kato | ..................... | H01L 29/513 |
| 2022/0059669 A1* | 2/2022 | Tomida | ................. | H01L 29/516 |
| 2022/0157999 A1* | 5/2022 | Wang | ................ | H01L 29/40117 |

* cited by examiner

NITRIDE SEMICONDUCTOR DEVICE AND METHOD OF MANUFACTURING THE SAME

CROSS REFERENCE TO RELATED APPLICATION

This application is based on Japanese Patent Application No. 2021-029176 filed on Feb. 25, 2021, the disclosure of which is incorporated herein by reference.

TECHNICAL FIELD

The present disclosure relates to a nitride semiconductor device and a manufacturing method of the nitride semiconductor device.

BACKGROUND

A nitride semiconductor device may include a gate insulation film.

SUMMARY

The present disclosure describes a nitride semiconductor device having a gate insulation film, and further describes a method for manufacturing the nitride semiconductor device including formation of the gate insulation film.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

Figure 1:
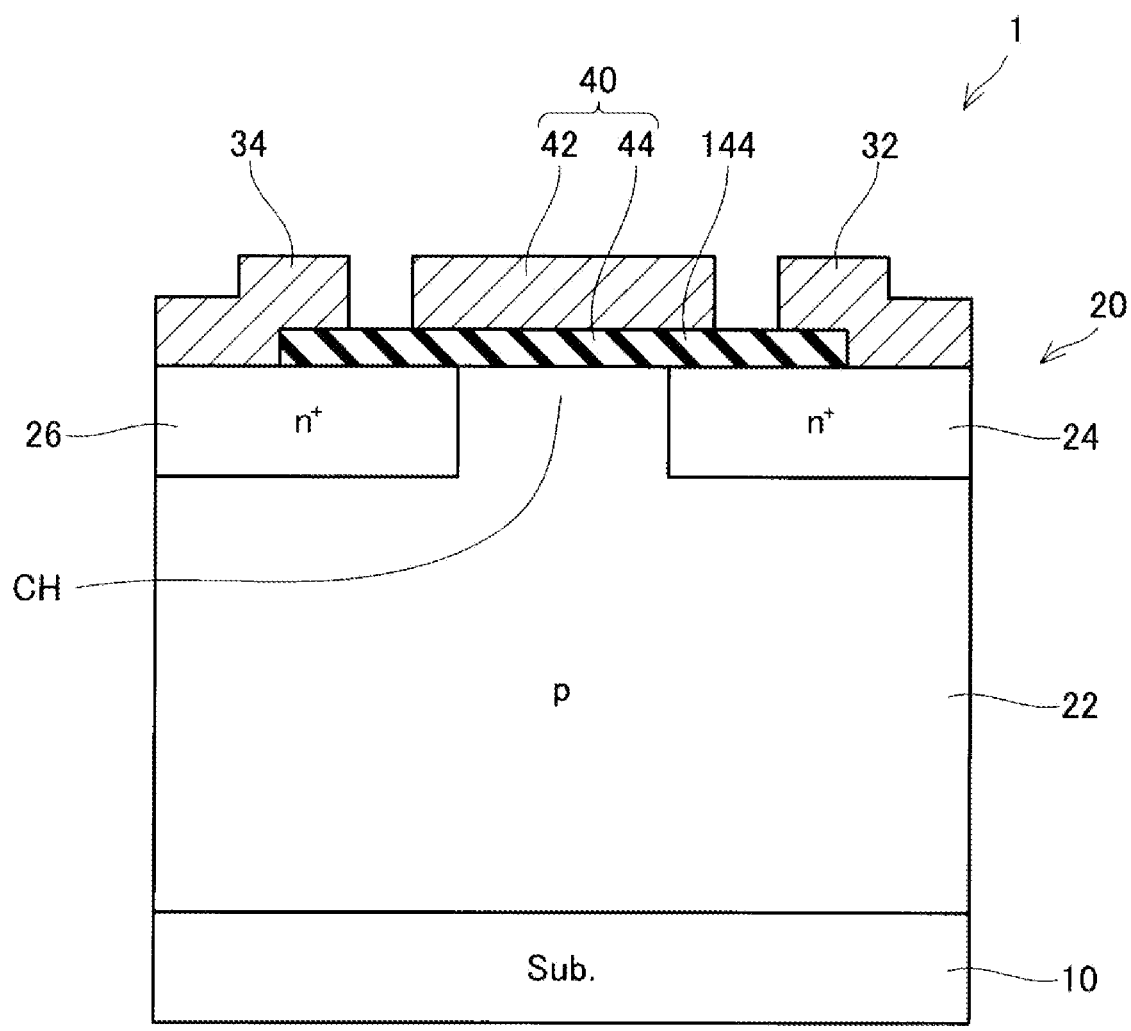
FIG. 1 schematically illustrates a cross sectional view of a part of a nitride semiconductor device in a first embodiment.

A gate insulation film in a nitride semiconductor device may be formed by stacking a silicon nitride film and a silicon oxide film on a nitride semiconductor layer in a nitride semiconductor device. The silicon nitride film has a negative band offset with respect to a nitride semiconductor layer. Therefore, in the gate insulation film, a well potential is formed in a valence band of the silicon nitride film, and holes are accumulated in the well potential. When the holes are accumulated in the well potential, a gate threshold voltage may vary.

A method according to a first aspect of the present disclosure for manufacturing a nitride semiconductor device includes formation of a gate insulation film above a nitride semiconductor layer. The formation of the gate insulation film includes forming silicon oxynitride film in contact with a surface of the nitride semiconductor layer. The formation of the silicon oxynitride film includes oxidation of a film source material having both of silicon and nitride in a molecule to form the silicon oxynitride film. Therefore, the well potential is not formed in the gate insulation film having the silicon oxynitride film. Therefore, in the gate insulation film, the accumulation of holes is suppressed. In the nitride semiconductor device manufactured by this manufacturing method, the variation in the gate threshold voltage is suppressed.

A nitride semiconductor device according to a second aspect of the present disclosure includes a nitride semiconductor layer and a gate insulation film disposed above the nitride semiconductor layer. The gate insulation film includes a silicon oxynitride film in contact with a surface of the nitride semiconductor layer. The silicon oxynitride film includes: a first portion that is in contact with a surface of the nitride semiconductor layer; and a second portion that faces the nitride semiconductor layer through the first portion. Carbon concentration in the second portion is lower than carbon concentration in the first portion. Therefore, the well potential is not formed in the gate insulation film having the silicon oxynitride film. Therefore, in the gate insulation film, the accumulation of holes is suppressed. In the nitride semiconductor device described above, the variation in the gate threshold voltage is suppressed.

A nitride semiconductor device according to a third aspect of the present disclosure includes a nitride semiconductor layer and a gate insulation film disposed above the nitride semiconductor layer. The gate insulation film includes: a silicon oxynitride film that is in contact with a surface of the nitride semiconductor layer; and an upper insulation film that is disposed above the silicon oxynitride film. Material of the upper insulation film is different from material of the silicon oxynitride film. Band offset of the upper insulation film with respect to the silicon oxynitride film is larger than band offset of the silicon oxynitride film with respect to the nitride semiconductor layer. Therefore, the well potential is not formed in the gate insulation film having the silicon oxynitride film. Therefore, in the gate insulation film, the accumulation of holes is suppressed. In the nitride semiconductor device described above, the variation in the gate threshold voltage is suppressed.

The following describes several embodiments in the present description by reference to the drawings. However, the technique disclosed in the present description is not limited to the examples described below, and is applicable to various types of nitride semiconductor devices having an insulated gate portion. Although a planar type insulated gate portion is described in the following, the technique disclosed in the present description can also be applied to a trench type insulated gate portion.

First Embodiment

As illustrated in FIG. 1, a nitride semiconductor device 1 is a switching element such as a horizontal metal-insulator-semiconductor field-effect transistor (MISFET) or a horizontal metal-oxide semiconductor field-effect transistor (MOSFET). The nitride semiconductor device 1 includes a substrate 10, a nitride semiconductor layer 20, a drain electrode 32, a source electrode 34, and a planar insulated gate portion 40.

The substrate 10 is made of material capable of crystal growth of a nitride semiconductor from its surface, and is a gallium nitride (GaN) substrate. In addition to the above example, the substrate 10 may be made of, for example, silicon or sapphire.

The nitride semiconductor layer 20 includes a semiconductor layer made of III-V compound semiconductor having nitrogen as a group V element, and is formed by crystal growth from the surface of the substrate 10. The nitride semiconductor layer 20 is not particularly limited, but it may made of gallium nitride (GaN) as described in this example. The nitride semiconductor layer 20 includes a p-type body region 22, an n$^+$ type drain region 24, and an n$^+$ type source region 26.

The body region 22 has at least a portion (hereinafter referred to as a channel region CH) that separates the drain region 24 and the source region 26. The body region 22 is a p-type region having, for example, magnesium (Mg) as a dopant. The channel region CH is provided at a position exposed on the surface of the nitride semiconductor layer 20, and is arranged directly below the insulated gate portion 40.

The drain region 24 is arranged at a position exposed on the surface of the nitride semiconductor layer 20, and is an n-type region having silicon (Si) as a dopant. The drain region 24 is formed by introducing silicon into a surface layer portion of the nitride semiconductor layer 20 by using an ion injection technique.

The source region 26 is arranged at a position exposed on the surface of the nitride semiconductor layer 20, and is an n-type region having silicon (Si) as a dopant. The source region 26 is formed by introducing silicon into a surface layer portion of the nitride semiconductor layer 20 by using an ion injection technique.

The drain electrode 32 and the source electrode 34 are provided above the surface of the nitride semiconductor layer 20. The insulated gate portion 40 is arranged between the drain electrode 32 and the source electrode 34. The drain electrode 32 is arranged to be in contact with the drain region 24, and is in ohmic contact with the drain region 24. The source electrode 34 is arranged to be in contact with the source region 26, and is in ohmic contact with the source region 26.

The insulated gate portion 40 is provided above the surface of the nitride semiconductor layer 20, and is arranged to face the channel region CH of the body region 22. The insulated gate portion 40 includes a gate electrode 42 and a gate insulation film 44.

The gate electrode 42 is arranged to face the channel region CH via the gate insulation film 44. The gate insulation film 44 is arranged between the nitride semiconductor layer 20 and the gate electrode 42, and separates the nitride semiconductor layer 20 and the gate electrode 42 by insulation. The gate insulation film 44 has a single layered silicon oxynitride film 144 (SiON film).

The following describes the operation of the nitride semiconductor device 1. In a state where a voltage such that the drain electrode 32 has a higher potential than the source electrode 34 is applied between the drain electrode 32 and the source electrode 34, when a voltage equal to or higher than a threshold voltage is applied to the gate electrode 42, an inversion layer is generated in the channel region CH, and the drain region 24 and the source region 26 are electrically connected through the inversion layer. As a result, conduction occurs between the drain electrode 32 and the source electrode 34, and the nitride semiconductor device 1 is turned on. When the voltage applied to the gate electrode 42 becomes smaller than the threshold voltage, the inversion layer generated in the channel region CH disappears, and the nitride semiconductor device 1 is turned off. The nitride semiconductor device 1 may function as a switching element for controlling a current flowing between the drain electrode 32 and the source electrode 34.

In the nitride semiconductor device 1, the gate insulation film 44 includes the single layered silicon oxynitride film 144. The silicon oxynitride film 144 is in contact with the surface of the nitride semiconductor layer 20, and forms an interface with the nitride semiconductor layer 20. The silicon oxynitride film 144 has a positive band offset with respect to the nitride semiconductor layer 20 such as GaN in the present example. Therefore, the well potential is not formed in the valence band of the silicon oxynitride film 144. As a result, the accumulation of the holes in the silicon oxynitride film 144 is suppressed, and the variation in the gate threshold voltage is suppressed.

The following describes a method for manufacturing the nitride semiconductor device 1. The following describes a film formation of the gate insulation film 44 in the method for manufacturing the nitride semiconductor device 1. The following omits the description of the methods other than the film formation of the gate insulation film 44.

Figure 2:
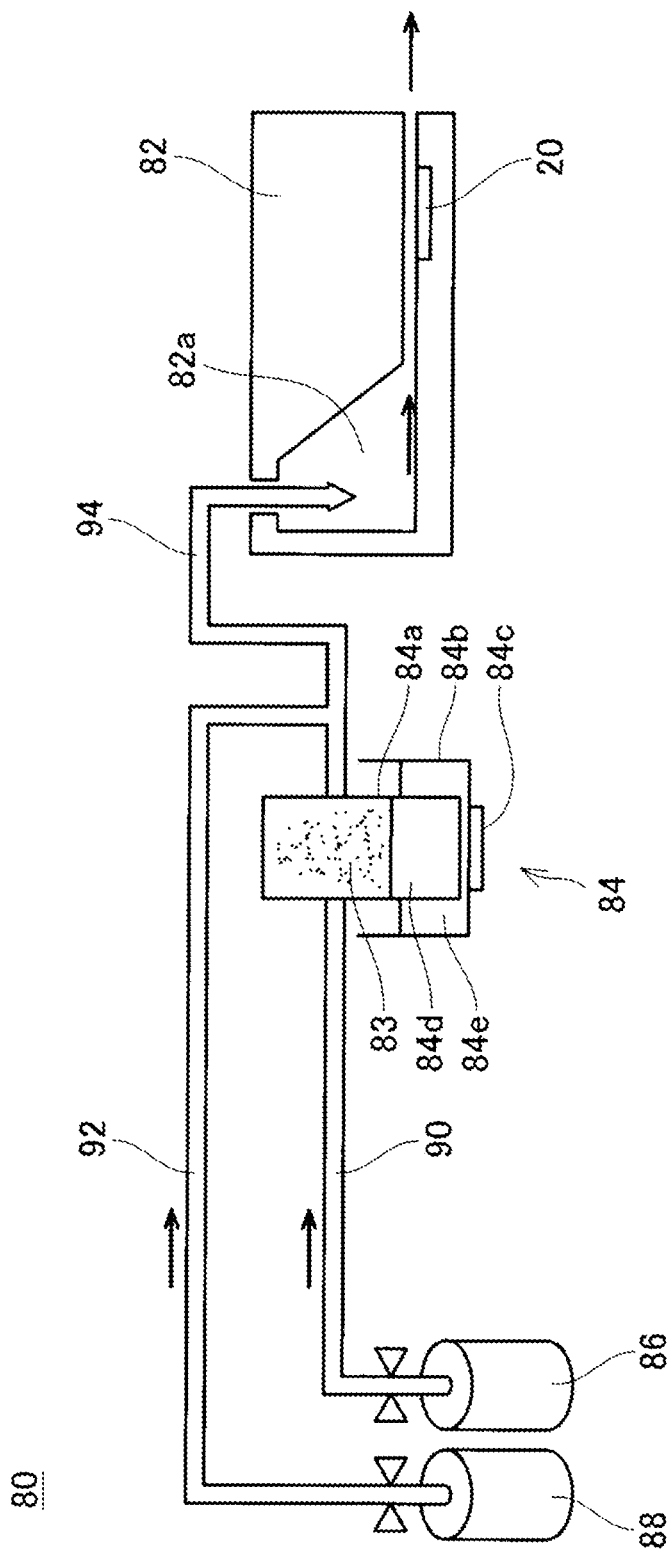
FIG. 2 illustrates the configuration of a mist chemical vapor deposition (CVD) apparatus.

In the present example, the gate insulation film 44 is formed by a mist chemical deposition (CVD) method. Other coating methods such as a spray method, a printing method or an inkjet method may be used instead of the mist CVD method. FIG. 2 schematically illustrates the configuration of a mist CVD apparatus 80 that executes the mist CVD method. The mist CVD apparatus 80 includes a furnace 82, a mist generator 84, a carrier gas supply source 86 and an oxidation gas supply source 88. FIG. 2 illustrates a fine channel type mist CVD apparatus 80, another example, for example, a linear source method or a hot wall type mist CVD apparatus may be used instead of the fine channel type mist CVD apparatus.

The furnace 82 has a chamber 82a. The nitride semiconductor layer 20 prior to the formation of a variety of electrodes such as the drain electrode, the source electrode and the gate electrode is placed inside the chamber 82a. The furnace 82 has a built-in heater and can heat the nitride semiconductor layer 20 in the chamber 82a.

The mist generator 84 includes a mist generating tank 84a, a container 85b and an ultrasonic vibrator 84c.

A solution 84d is stored in the mist generating tank 84a. The solution 84d is obtained by dissolving film source material for forming the silicon oxynitride film 144 of the gate insulation film 44 in a solvent. The film source material is an organic substance having both of silicon and nitrogen in a molecule. For example, polysilazane or hexamethyldisilazane can be used as the film source material. As the solvent, an organic solvent such as dimethyl ether, methyl acetate, acetonitrile or dibutyl ether can be used.

The container 84b stores a liquid 84e such as water. The lower part of the mist generating tank 84a is immersed in the liquid 84e. The ultrasonic vibrator 84c is fixed to the bottom surface of the container 84b. The ultrasonic vibrator 84c applies an ultrasonic wave to the liquid 84e. The ultrasonic wave applied to the liquid 84e is transmitted to the liquid 84d inside the mist generating tank 84a through the liquid 84e. Then, the liquid surface of the solution 84d vibrates, and the mist 83 of the solution 84d is generated in the space above the solution 84d. The mist generating apparatus 84 generates the mist 83 of the solution 84d inside the mist generating tank 84a. The mist generating tank 84a is connected to the furnace 82 through a source material supply pipe 94. The mist 83 is supplied to the furnace 82 through the source material supply pipe 94 from the mist generating tank 84a. The mist 83 that has flowed through the furnace 82 to the downstream end is discharged to the outside of the furnace 82.

The carrier gas supply source 86 is connected to the mist generating tank 84a through the carrier gas supply pipe 90.

The carrier gas supply source 86 supplies a carrier gas, for example, an inert gas such as argon to the mist generating tank 84a.

The oxidation gas supply source 88 is connected to the route of the source material supply pipe 94 through the oxidation gas supply pipe 92. The oxidation gas supply source 88 supplies an oxidizing agent, for example, ozone in the present embodiment, to the source material supply pipe 94. The oxidizing agent may be, for example, water vapor ($H_2O$). The oxidizing agent may also be referred to as an oxidant.

In the formation of the gate insulation film, the nitride semiconductor layer 20 is placed in the chamber 82a of the furnace 82. Subsequently, the nitride semiconductor layer 20 is heated by the furnace 82. During the formation of the gate insulation film, the temperature of the nitride semiconductor layer 20 is maintained at about 400 degree Celsius.

Subsequently, the ultrasonic vibrator 84c is operated to generate the mist 83 from the solution 84d. At the same time, the supply of the carrier gas to the mist generating tank 84a from the carrier gas supply source 86 is started, and the supply of the oxidation gas from the oxidation gas supply source 88 to the source material supply pipe 94 is started. The carrier gas that has flowed into the mist generating tank 84a from the carrier gas supply pipe 90 flows to the source material supply pipe 94 along with the mist 83 in the mist generating tank 84a. In the source material supply pipe 94, the mist 83 flows toward the furnace 82 along with the carrier gas. The oxidation gas flows from the oxidation gas supply pipe 92 into the source material supply pipe 94 in the route towards the source material supply pipe 94. In the portion of the source material supply pipe 94 on the downstream side of the joint part with the oxidation gas supply pipe 92, the mist 83 flows toward the furnace 82 along with the carrier gas and the oxidation gas.

When the mist 83, the carrier gas and the oxidation gas reach the downstream end of the source material supply pipe 94, they flow into the chamber 82a of the furnace 82. A part of the mist 83 flowing into the chamber 82a adheres to the surface of the nitride semiconductor layer 20. The solvent in the mist 83 adhering to the surface of the nitride semiconductor layer 20 volatilizes, and the film source material having silicon and nitrogen adheres to the surface of the nitride semiconductor layer 20. The film source material is oxidized by the oxidation gas while adhering to the surface of the nitride semiconductor layer 20. The oxidized film source material becomes the silicon oxynitride film 144. The gate insulation film 44 made of the silicon oxynitride film 144 grows at the surface of the nitride semiconductor layer 20.

After the formation of the gate insulation film 44 made of the single layered silicon oxynitride film 144, the nitride semiconductor layer 20 is annealed at about 800 degree Celsius in a nitrogen atmosphere. Through this method, it is possible to form the gate insulation film 44.

As described above, the mist CVD method disclosed in the present description forms a silicon oxynitride film 144 by oxidizing the film source material having both of silicon and nitrogen in the molecule. For example, the method using ammonia as a nitrogen source has a situation in which the surface of the nitride semiconductor layer 20 is damaged by hydrogen radicals generated when ammonia is decomposed. On the other hand, in the present embodiment, since the film source material having silicon and nitride in the molecule, ammonia as the nitrogen source is not used. Therefore, it is possible to prevent the surface of the nitride semiconductor layer 20 from being damaged by hydrogen radicals. As a result, the nitride semiconductor device 1 can have higher channel mobility.

In the mist CVD method described in the present description, the oxidation gas in a non-plasma state is used for oxidizing the film source material and forming the silicon oxynitride film 144. Therefore, in the mist CVD method described in the present description, since the surface of the nitride semiconductor layer 20 is not exposed to the oxidation gas in the plasma state, it is possible to suppress the damage to the surface of the nitride semiconductor layer 20. As a result, the nitride semiconductor device 1 can have higher channel mobility.

Second Embodiment

Figure 3:
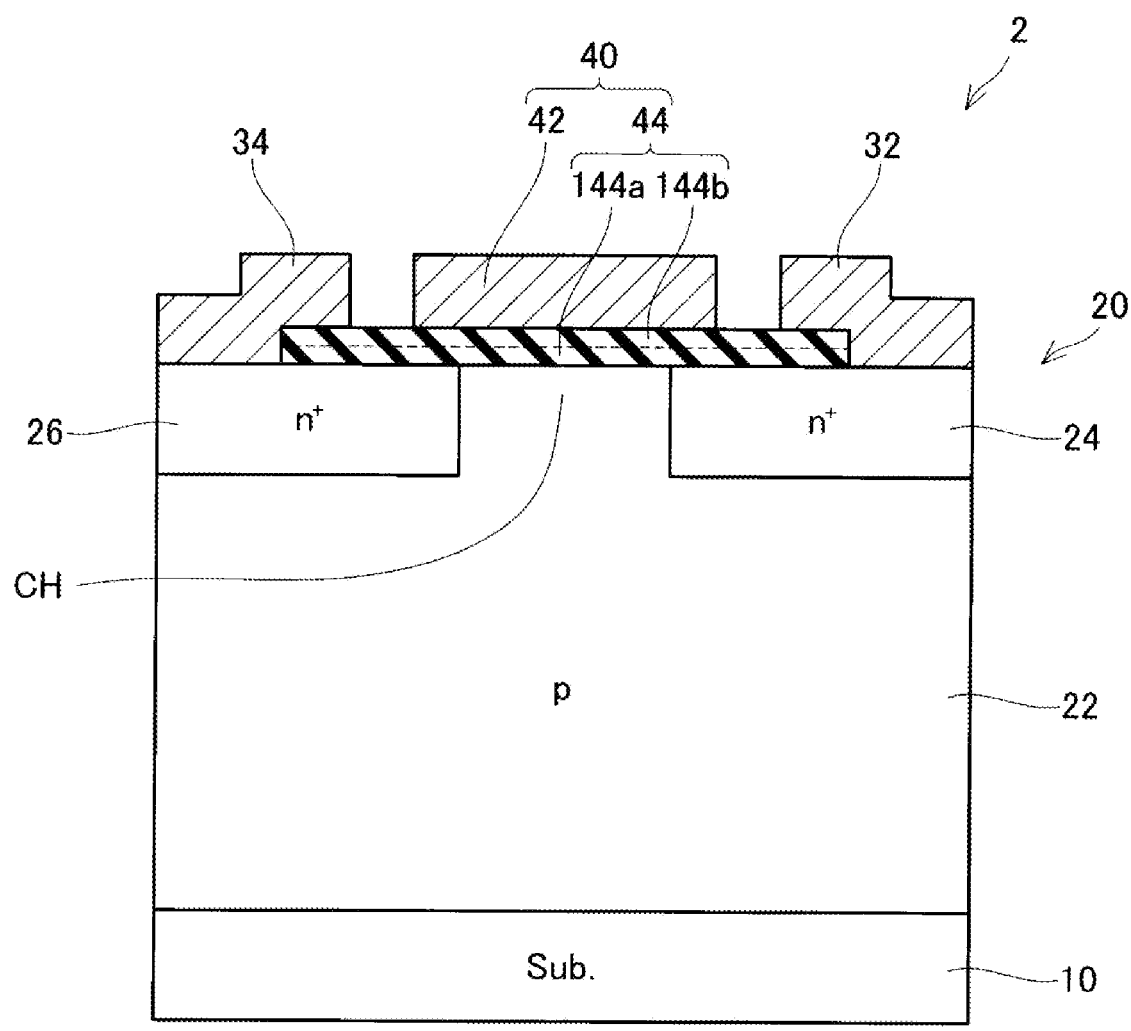
FIG. 3 schematically illustrates a cross sectional view of a part of a nitride semiconductor device in a second embodiment.

FIG. 3 illustrates a nitride semiconductor device 2 in a second embodiment. The parts identical to the nitride semiconductor device 1 in the first embodiment are given by the identical reference numerals, and the following does not describe the identical parts. In the nitride semiconductor device 2, the gate insulation film 44 includes a first silicon oxynitride film 144a and a second silicon oxynitride film 144b. The first silicon oxynitride film 144a may also be referred to as a first portion, and the second silicon oxynitride film 144b may also be referred to as a second portion.

The first silicon oxynitride film 144a is provided to be in contact with the surface of the nitride semiconductor layer 20. The second silicon oxynitride film 144b is provided above the surface of the first silicon oxynitride film 144a, and is provided to face the nitride semiconductor layer 20 through the first silicon oxynitride film 144a.

The first silicon oxynitride film 144a and the second silicon oxynitride film 144b are formed by using the mist CVD method as in the first embodiment. When the mist CVD method is used for film formation, the oxidant concentration is lower at the formation of the first silicon oxynitride film 144a than the formation of the second silicon oxynitride film 144b. The oxidation level at the formation of the first silicon oxynitride film 144a is relatively low, and the oxidation level at the formation of the second silicon oxynitride film 144b is relatively high.

By lowing the oxidation level at the formation of the first silicon oxynitride film 144a in contact with the nitride semiconductor layer 20, it is possible to suppress the oxidation of the surface of the nitride semiconductor layer 20, and it is possible to suppress the damage to the surface of the nitride semiconductor layer 20. As a result, the nitride semiconductor device 2 can have higher channel mobility. On the other hand, by raising the oxidation level at the formation of the second silicon oxynitride film 144b separated from the nitride semiconductor layer 20, it is possible to have a higher film quality of the second silicon oxynitride film 144b, and it is possible to suppress a leakage current. The nitride semiconductor device 2 including the first silicon oxynitride film 144a and the second silicon oxynitride film 144b can attain both of higher channel mobility and lower leakage current while suppressing variation in the gate threshold voltage.

As described above, the oxidation level at the formation of the first silicon oxynitride film 144a is relatively low, and the oxidation level at the formation of the second silicon oxynitride film 144b is relatively high. As a result, a relatively large amount of carbon included in the organic film material such as polysilazane or hexamethyldisilazane is incorporated into the first silicon oxynitride film 144a, and a relatively low amount of carbon included in the organic film material such as polysilazane or hexamethyldisilazane is incorporated into the second silicon oxynitride film 144b.

In the gate insulation film 44, the first silicon oxynitride film 144a and the second silicon oxynitride film 144b may not be clearly distinguished. For example, in the formation of the gate insulation film 44, in a situation to continuously increase the supply oxidant concentration, the carbon concentration in the gate insulation film 44 continuously increases in a direction from the surface of the nitride semiconductor layer 20. In such a case, an arbitrary thickness of the gate insulation film 44 in contact with the surface of the nitride semiconductor layer 20 is the first silicon oxynitride film 144a, and the remaining portion of the gate insulation film 44 is the second silicon oxynitride film 144b. Accordingly, it satisfies the relationship such that the carbon concentration in an arbitrary position of the first silicon oxynitride film 144a is larger than the carbon concentration in an arbitrary position of the second silicon oxynitride film 144b. The nitride semiconductor device 2 in the second embodiment also includes such a case. The carbon concentration included in the gate insulation film 44 of the nitride semiconductor device 2 in the second embodiment can have a variety of profiles as long as the carbon concentration monotonically increases in a direction from the surface of the nitride semiconductor layer 20. In any of the profiles, the nitride semiconductor device 2 can attain both of higher channel mobility and lower leakage current while suppressing variation in the gate threshold voltage.

Third Embodiment

Figure 4:
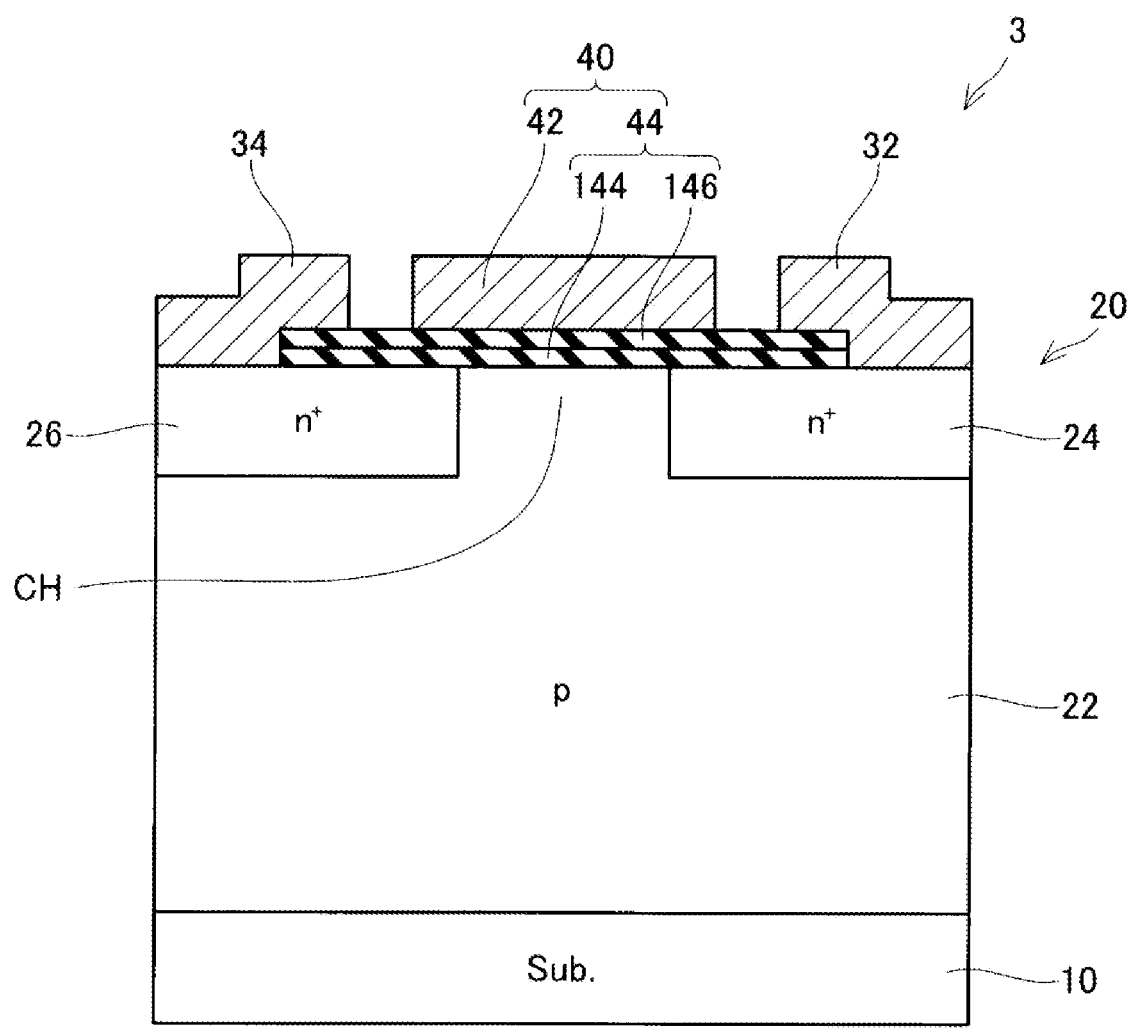
FIG. 4 schematically illustrates a cross sectional view of a part of a nitride semiconductor device in a third embodiment.

FIG. 4 illustrates a nitride semiconductor device 3 in a third embodiment. The parts identical to the nitride semiconductor device 1 in the first embodiment are given by the identical reference numerals, and the following does not describe the identical parts. In the nitride semiconductor device 3, the gate insulation film 44 includes the silicon oxynitride film 144 and an upper insulation film 146.

The silicon oxynitride film 144 is provided to be in contact with the surface of the nitride semiconductor layer 20. The upper insulation film 146 is provided above the surface of the silicon oxynitride film 144, and is provided to face the nitride semiconductor layer 20 through the silicon oxynitride film 144.

The band offset of the upper insulation film 146 with respect to the nitride semiconductor layer 20 is larger than the band offset of the silicon oxynitride film 144 with respect to the nitride semiconductor layer 20. The material of the upper insulation film 146 is not particularly limited; however, it is, for example, silicon oxide film ($SiO_2$) or a metal oxide film. The metal oxide film may also be alumina ($Al_2O_3$). The upper insulation film 146 is not particularly limited, but may be formed by using, for example, a mist CVD method.

The silicon oxynitride film 144 is provided to be in contact with the nitride semiconductor layer 20. In the nitride semiconductor device 3, since the well potential is not formed on the silicon oxynitride film 144, it is possible to suppress variation in the gate threshold voltage. The band offset of the upper insulation film 146 with respect to the nitride semiconductor layer 20 is larger than the band offset of the silicon oxynitride film 144 with respect to the nitride semiconductor layer 20. The upper insulation film 146 has a higher dielectric breakdown strength than the silicon oxynitride film 144. As a result, in the nitride semiconductor device 3, the dielectric breakdown strength in the gate insulation film 44 increases.

As described above, the method for manufacturing the nitride semiconductor device can include the formation of the gate insulation film for forming a gate insulation film above the nitride semiconductor layer. The formation of the gate insulation can include the formation of the silicon oxynitride film to be in contact with the surface of the nitride semiconductor layer. In the formation of the silicon oxynitride film, the film source material including both of silicon and nitrogen in the molecule is oxidized and the silicon oxynitride film is formed. In the formation of the silicon oxynitride film, other coating methods such as the mist CVD method, the spray method, the printing method or the inkjet method may also be used. According to the manufacturing method, hydrogen radicals are not generated in a situation of using ammonia as the nitrogen source. Therefore, in the manufacturing method, it is possible to suppress damage to the surface of the nitride semiconductor layer.

The film source material is not particularly limited, but may be, for example, polysilazane or hexamethyldisilazane.

The formation of the silicon oxynitride film is not particularly limited, but the silicon oxynitride film may be formed by using, for example, the mist CVD method. According to the mist CVD method, it is possible to oxidize the film source material by using the oxidation gas in the non-plasma state. Therefore, in the mist CVD method, since the surface of the nitride semiconductor layer is not exposed to the oxidation gas in the plasma state, it is possible to suppress the damage to the surface of the nitride semiconductor layer.

The silicon oxynitride film includes the first silicon oxynitride film and the second silicon oxynitride film. The first silicon oxynitride film is in contact with the surface of the nitride semiconductor layer, and the second silicon oxynitride film faces the nitride semiconductor layer through the first silicon oxynitride film. In the formation of the silicon oxynitride film, the oxidant concentration is lower in the formation of the first silicon oxynitride film than in the formation of the second silicon oxynitride film. According to the manufacturing method, it is possible that the first silicon oxynitride film is formed under the condition of weaker oxidation level to ensure higher channel mobility, and that the second silicon oxynitride film is formed under the condition of stronger oxidation level to ensure lower leakage current. According to the manufacturing method, it is possible to manufacture the nitride semiconductor device with both of higher channel mobility and lower leakage current.

The formation of the gate insulation film may further include the formation of the upper insulation film above the silicon oxynitride film. The material of the upper insulation film is different from the material of the silicon oxynitride film. The band offset of the upper insulation film with respect to the nitride semiconductor layer is larger than the band offset of the silicon oxynitride film with respect to the nitride semiconductor layer. The upper insulation film may be a silicon oxide film or a metal oxide film. According to the manufacturing method, it is possible to manufacture the nitride semiconductor device with both of higher channel mobility and higher dielectric breakdown resistance.

In one of the above embodiments, it is possible to include the gate insulation film provided above the nitride semiconductor layer. It is possible that the gate insulation film includes the silicon oxynitride film in contact with the surface of the nitride semiconductor layer. It is possible that the silicon oxynitride film includes the first silicon oxynitride film and the second silicon oxynitride film. The first silicon oxynitride film is in contact with the surface of the nitride semiconductor layer, and the second silicon oxynitride film faces the nitride semiconductor layer through the first silicon oxynitride film. The carbon concentration in the second silicon oxynitride film is lower than the carbon concentration in the first silicon oxynitride film. It is possible that the nitride semiconductor device has both of higher channel mobility and lower leakage current.

In one of the above embodiments, it is possible to include the gate insulation film provided above the nitride semiconductor layer. It is possible that the gate insulation film includes the silicon oxynitride film and the upper insulation film. The silicon oxynitride film is in contact with the surface of the nitride semiconductor layer. The upper insulation film is provided above the silicon oxynitride film. The material of the upper insulation film is different from the material of the silicon oxynitride. The band offset of the upper insulation film with respect to the nitride semiconductor layer is larger than the band offset of the silicon oxynitride film with respect to the nitride semiconductor layer. The upper insulation film may be a silicon oxide film or a metal oxide film. It is possible that the nitride semiconductor device has both of higher channel mobility and higher dielectric breakdown resistance.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A method for manufacturing a nitride semiconductor device, the method comprising:
    forming a gate insulation film above a nitride semiconductor layer,
    wherein the forming of the gate insulation film includes utilizing a mist chemical vapor deposition method to form a silicon oxynitride film in contact with a surface of the nitride semiconductor layer,
    wherein the forming of the silicon oxynitride film includes oxidizing a film source material having both of silicon and nitride in a molecule to form the silicon oxynitride film, and
    wherein ammonia is not used as a nitrogen source in the mist chemical vapor deposition method.

2. The method according to claim 1,
    wherein the film source material is one of polysilazane or hexamethyldisilazane.

3. The method according to claim 1,
    wherein the silicon oxynitride film includes:
        a first portion that is in contact with a surface of the nitride semiconductor layer; and
        a second portion that faces the nitride semiconductor layer through the first portion, and
    wherein, in the forming of the silicon oxynitride film, oxidant concentration in formation of the first portion is lower than oxidant concentration in formation of the second portion.

4. The method according to claim 1,
    wherein the forming of the gate insulation film further includes forming an upper insulation film above the silicon oxynitride film,
    wherein material of the upper insulation film is different from material of the silicon oxynitride film, and
    wherein band offset of the upper insulation film with respect to the silicon oxynitride film is larger than band offset of the silicon oxynitride film with respect to the nitride semiconductor layer.

5. The method according to claim 4,
    wherein the upper insulation film is one of a silicon oxide film or a metal oxide film.

6. A nitride semiconductor device comprising:
    a nitride semiconductor layer; and
    a gate insulation film disposed above the nitride semiconductor layer,
    wherein the gate insulation film includes a silicon oxynitride film in contact with a surface of the nitride semiconductor layer,
    wherein the silicon oxynitride film includes:
        a first portion that is in contact with the surface of the nitride semiconductor layer; and
        a second portion that faces the nitride semiconductor layer through the first portion,
    wherein carbon concentration in the second portion is lower than carbon concentration in the first portion, and
    wherein carbon concentration in the silicon oxynitride film monotonically increases in a direction from the second portion to the first portion throughout the silicon oxynitride film.

7. A nitride semiconductor device comprising:
    a nitride semiconductor layer with a conductivity type; and
    a gate insulation film disposed on the nitride semiconductor layer,
    wherein the gate insulation film includes:
        a silicon oxynitride film that is in contact with a surface of the nitride semiconductor layer; and
        an upper insulation film that is disposed above the silicon oxynitride film,
    wherein material of the upper insulation film is different from material of the silicon oxynitride film, and
    wherein band offset of the upper insulation film with respect to the silicon oxynitride film is larger than band offset of the silicon oxynitride film with respect to the nitride semiconductor layer.

8. The nitride semiconductor device according to claim 7,
    wherein the upper insulation film is one of a silicon oxide film or a metal oxide film.

9. The method according to claim 1,
    wherein oxidation gas in a non-plasma state is utilized to oxidize the film source material.

10. The nitride semiconductor device according to claim 7,
    wherein the upper insulation film is a metal oxide film.

11. The nitride semiconductor device according to claim 7,
    wherein the conductivity type is one of a plurality of conductivity types including a first conductivity type and a second conductivity type, and
    wherein the nitride semiconductor layer includes a body region of the first conductivity type, a drain region of the second conductivity type, and a source region of the second conductivity type.

* * * * *